(12) United States Patent
Yang et al.

(10) Patent No.: US 8,530,320 B2
(45) Date of Patent: Sep. 10, 2013

(54) HIGH-NITROGEN CONTENT METAL RESISTOR AND METHOD OF FORMING SAME

(75) Inventors: Chih-Chao Yang, Glenmont, NY (US); Daniel C. Edelstein, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 202 days.

(21) Appl. No.: 13/155,801

(22) Filed: Jun. 8, 2011

(65) Prior Publication Data

US 2012/0313220 A1 Dec. 13, 2012

(51) Int. Cl.
*H01L 21/20* (2006.01)

(52) U.S. Cl.
USPC .................................. 438/384; 257/E21.006

(58) Field of Classification Search
USPC ................ 438/171, 190, 210, 230, 330, 384, 438/382; 257/E21.004, E21.006
See application file for complete search history.

(56) References Cited

U.S. PATENT DOCUMENTS

| 5,485,138 | A | | 1/1996 | Morris | |
|---|---|---|---|---|---|
| 6,001,741 | A | * | 12/1999 | Alers | 438/706 |
| 6,083,785 | A | | 7/2000 | Segawa et al. | |
| 6,207,560 | B1 | | 3/2001 | Lee | |
| 6,232,042 | B1 | | 5/2001 | Dunn et al. | |
| 6,337,289 | B1 | * | 1/2002 | Narwankar et al. | 438/776 |
| 6,518,203 | B2 | * | 2/2003 | Narwankar et al. | 438/776 |
| 8,420,531 | B2 | * | 4/2013 | Yang et al. | 438/643 |
| 2002/0055270 | A1 | * | 5/2002 | Narwankar et al. | 438/776 |
| 2004/0027234 | A1 | | 2/2004 | Hashimoto et al. | |
| 2004/0239478 | A1 | * | 12/2004 | Amadon et al. | 338/308 |
| 2006/0087400 | A1 | * | 4/2006 | Chinthakindi et al. | 338/309 |
| 2008/0030298 | A1 | * | 2/2008 | Yang et al. | 338/308 |
| 2012/0326311 | A1 | * | 12/2012 | Yang et al. | 257/751 |

* cited by examiner

*Primary Examiner* — Matthew Landau
*Assistant Examiner* — Joseph C Nicely
(74) *Attorney, Agent, or Firm* — Scully, Scott, Murphy & Presser, P.C.; Parashos Kalaitzis, Esq.

(57) ABSTRACT

A thin film metal resistor is provided that includes an in-situ formed metal nitride layer that is formed in a lower region of a deposited metal nitride layer. The in-situ formed metal nitride layer, together with the overlying deposited metal nitride layer, from a thin film metal resistor which has a nitrogen content that is greater than 60 atomic % nitrogen. The in-situ formed metal nitride layer is present on a nitrogen enriched dielectric surface layer. In accordance with the present disclosure, the in-situ formed metal nitride layer is formed during and/or after formation of the deposited metal nitride layer by reacting metal atoms from the deposited metal nitride layer with nitrogen atoms present in the nitrogen enriched dielectric surface layer. The presence of the in-situ formed metal nitride layer in the lower region of the metal nitride layer provides a two-component metal resistor having greater than 60 atomic % nitrogen therein.

14 Claims, 3 Drawing Sheets

HIGH-NITROGEN CONTENT METAL RESISTOR AND METHOD OF FORMING SAME

BACKGROUND

The present disclosure relates to a semiconductor structure and a method of forming the same. More particularly, the present disclosure provides a high-nitrogen content thin film metal resistor and a method of forming the same.

A resistor is one of the most common electrical components, and is used in almost every electrical device. In semiconductor device fabrication, it is well known to have thin film resistors embedded in the back-end-of-line (BEOL) structures of the chip through either a damascene approach or a subtractive etch method. BEOL thin film resistors are generally preferred over other types of resistors because of lower parasitic capacitance. Conventional resistor materials and fabrication methods, however, present a number of challenges.

In one approach, the sheet resistivity of the various resistors formed over the entire wafer may vary and go beyond specifications due to poor process control. In an advanced manufacturing line, wafers out of specification are often scrapped for quality control, which is expensive.

One material used for resistors is doped polysilicon. A problem with this conventional resistor material is that it can only provide a limited resistance within a limited dimension, which presents problems as further miniaturization of the device features continues. Resistive thin films such as chromium silicide (CrSi) and tantalum nitride (TaN) are also used as resistors in semiconductor devices. Prior art metal nitride resistors such as TaN are generally formed by physical vapor deposition and as such the nitrogen content within such resistors is less than 50 atomic percent. Manufacturing metal nitride resistors having a nitrogen content that is greater than 50 atomic % nitrogen is not possible using prior art deposition techniques due to nitrogen contamination related problems which are inherently present in such deposition processes.

SUMMARY

The present disclosure provides a thin film metal resistor that has a high-nitrogen content associated therewith. In some embodiments, the thin film metal resistor of the present disclosure can be integrated within a back-end-of the line (BEOL) process.

The term "thin film" as used in conjugation with the metal resistor of the present disclosure denotes that the metal resistor has a physical thickness of less than 500 nm. The term "high-nitrogen content" as also used in junction with the metal resistor of the present disclosure denotes that the metal resistor has a nitrogen content that is greater than 60 atomic %. In contrast, prior art thin film metal resistors have a nitrogen content that is less than 50 atomic %. The increased nitrogen content that is achieved by the thin film metal resistor of the present disclosure provides improved performance enhancement to the thin film metal resistor as compared to prior art thin film metal resistors. By improved "performance enhancement" it is meant that the metal resistor of the present disclosure provides higher electrical resistance as compared to a prior art metal resistor having the same dimension.

The thin film metal resistor of the present disclosure includes an in-situ formed metal nitride layer that is formed in a lower region of a deposited metal nitride layer. The in-situ formed metal nitride layer, together with the overlying deposited metal nitride layer, from the thin film metal resistor of the present disclosure which has a nitrogen content that is greater than 60 atomic % nitrogen. The in-situ formed metal nitride layer is present on a nitrogen enriched dielectric surface layer. In accordance with the present disclosure, the in-situ formed metal nitride layer is formed during and/or after formation of the deposited metal nitride layer by reacting metal atoms from the deposited metal nitride layer with nitrogen atoms present in the nitrogen enriched dielectric surface layer. The presence of the in-situ formed metal nitride layer in the lower region of the metal nitride layer provides a two-component metal resistor having greater than 60 atomic % nitrogen therein.

In one embodiment of the present disclosure, a method of forming a thin film metal resistor having a high-nitrogen content (i.e., greater than 60 atomic % nitrogen) is provided. The method of the present disclosure includes forming a nitrogen enriched dielectric surface layer within an upper region of a dielectric material layer. After providing the nitrogen enriched dielectric surface layer, a metal nitride layer is formed thereon. During and/or after formation of the metal nitride layer, another metal nitride layer forms in-situ in a lower region of the metal nitride layer. The another metal nitride layer is thus located between the nitrogen enriched dielectric surface layer and the overlying deposited metal nitride.

In some embodiments, a method is provided in which a resistor having a high-nitrogen content (i.e., greater than 60 atomic % nitrogen) is integrated in a back-end-of the line integration process. In this embodiment, the method includes providing a first dielectric material layer having at least one conductive material embedded therein. A dielectric capping layer is then formed atop the first dielectric material layer and atop the at least one conductive material. A second dielectric material layer is formed atop the dielectric capping layer, and thereafter a nitrogen enriched dielectric surface layer is formed within an upper region of the second dielectric material layer. Next, a metal nitride layer is formed atop the nitrogen enriched dielectric surface layer. During and/or after the forming of the metal nitride layer, another metal nitride layer forms in-situ in a lower region of the metal nitride layer. Another dielectric capping layer is then formed atop the metal nitride layer. The another dielectric capping layer, the metal nitride layer and the another metal nitride layer are then patterned to form a patterned material stack. A third dielectric material layer having a plurality of conductive structures embedded therein is then formed atop the exposed nitrogen enriched dielectric surface layer and the patterned material stack.

In another embodiment, the present disclosure relates to a semiconductor structure that includes a resistor having a high-nitrogen content (i.e., greater than 60 atomic % nitrogen) located on a nitrogen enriched dielectric surface layer. Specifically, the structure includes a dielectric material layer having a nitrogen enriched dielectric surface layer located in an upper region thereof; a metal nitride layer located atop the nitrogen enriched dielectric surface layer, wherein the metal nitride layer is separated from the nitrogen enriched dielectric surface layer of the dielectric material layer by an in-situ formed metal nitride layer. In the disclosed structure, the metal nitride layer and the in-situ formed metal nitride layer form a two-component metal resistor having a nitrogen content that is greater than 60 atomic % nitrogen.

DETAILED DESCRIPTION

The present disclosure, which provides a high-nitrogen content metal resistor and a method of forming the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the various embodiments of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
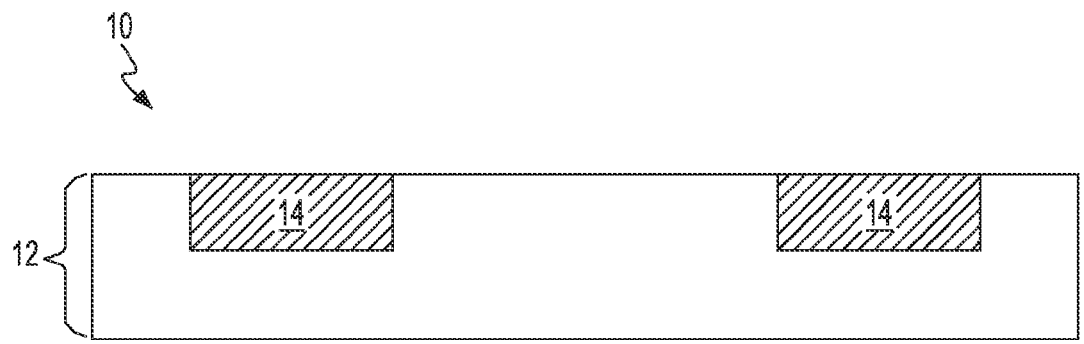
FIG. 1 is a pictorial representation (through a cross sectional view) illustrating an initial structure including a first dielectric material layer having at least one conductive material embedded therein that can be employed in one embodiment of the present disclosure.

Reference is first made to FIG. 1 which illustrates an initial structure 10 that can be employed in one embodiment of the present disclosure. The initial structure 10 includes a first dielectric material layer 12 that has at least one conductive material 14 embedded therein.

The first dielectric material layer 12 of the initial structure 10 may be located upon a substrate (not shown in the drawings of the present application). The substrate, which is not shown, may comprise a semiconducting material, an insulating material, a conductive material or any combination thereof. When the substrate is comprised of a semiconducting material, any material having semiconductor properties such as, for example, Si, SiGe, SiGeC, SiC, Ge alloys, GaAs, InAs, InP and other III/V or II/VI compound semiconductors, may be used. In addition to these listed types of semiconducting materials, the substrate that is located beneath the first dielectric material layer 12 can be a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or any combination thereof including multilayers. When the substrate is a conducting material, the substrate may include, for example, polySi, an elemental metal, alloys of elemental metals, a metal silicide, a metal nitride or any combination thereof including multilayers. When the substrate comprises a semiconducting material, one or more semiconductor devices such as, for example, complementary metal oxide semiconductor (CMOS) devices can be fabricated thereon. When the substrate comprises a combination of an insulating material and a conductive material, the substrate may represent an underlying interconnect level of a multilayered interconnect structure.

The first dielectric material layer 12 that is employed in the present disclosure may comprise any interlevel or intralevel dielectric including inorganic dielectrics or organic dielectrics. In one embodiment, the first dielectric material layer 12 may be non-porous. In another embodiment, the first dielectric material layer 12 may be porous. Some examples of suitable dielectrics that can be used as the first dielectric material layer 12 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material layer 12 typically has a dielectric constant that is about 4.0 or less, with a dielectric constant of about 2.8 or less being more typical. All dielectric constants mentioned herein are relative to a vacuum, unless otherwise noted. These dielectrics generally have a lower parasitic cross talk as compared with dielectric materials that have a higher dielectric constant than 4.0. The thickness of the first dielectric material layer 12 may vary depending upon the type of dielectric material used as well as the exact number of dielectric layers within the first dielectric material layer 12. When the first dielectric material layer 12 is an element of an interconnect structure, the first dielectric material layer 12 may have a thickness from 50 nm to 1000 nm.

As stated above, the initial structure 10 also includes at least one conductive material 14 embedded therein. As shown in FIG. 1, the at least one conductive material 14 has an upper surface that is co-planar with an upper surface of the first dielectric material layer 12. The at least one conductive material 14 can be formed by first providing at least one opening into the first dielectric material layer 12, and then filling the at least one opening with a conductive material.

The at least one opening that is formed into the first dielectric material layer 12 can be formed utilizing lithography and etching. The lithographic process includes forming a photoresist (not shown) atop the first dielectric material layer 12, exposing the photoresist to a desired pattern of radiation and developing the exposed photoresist utilizing a conventional resist developer. In some embodiments, a hard mask such as, for example, a layer of silicon oxide and/or silicon nitride, can be interposed between the photoresist and the first dielectric material layer 12. The etching process includes a dry etching process (such as, for example, reactive ion etching, ion beam etching, plasma etching or laser ablation), and/or a wet chemical etching process. Typically, reactive ion etching is used in providing the at least one opening into at least the first dielectric material layer 12. In some embodiments, the etching process includes a first pattern transfer step in which the pattern provided to the photoresist is transferred to the hard mask, the patterned photoresist is then removed by an ashing step, and thereafter, a second pattern transfer step is used to transfer the pattern from the patterned hard mask into the underlying first dielectric material layer 12.

The depth of the at least one opening that is formed into the first dielectric material layer 12 (measured from the upper surface of the first dielectric material layer 12 to the bottom wall of the at least one opening) may vary. In some embodiments, the at least one opening may extend entirely through the first dielectric material layer 12. In yet other embodiments, the at least one opening stops within the first dielectric material layer 12 itself In yet further embodiments, different depth openings can be formed into the first dielectric material layer 12.

The at least one opening that is formed into the first dielectric material layer 12 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the at least one opening that houses the conductive material is shown as a line opening. When a via or line is formed, a single damascene process (including the above mentioned lithography and etching steps) can be employed. When a combined via/line is formed a dual damascene process (including at least one iteration of the above mentioned lithography and etching steps) can be employed.

Next, a diffusion barrier (not show) can be formed within the at least one opening and atop the first dielectric material layer 12. The diffusion barrier includes Ta, TaN, Ti, TiN, Ru, RuN, RuTa, RuTaN, W, WN or any other material that can serve as a barrier to prevent a conductive material from diffusing there through. The thickness of the diffusion barrier may vary depending on the deposition process used as well as the material employed. Typically, the diffusion barrier has a thickness from 2 to 50 nm, with a thickness from 5 to 20 nm being more typical. The diffusion barrier can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating.

In some embodiments, an optional plating seed layer (not specifically shown) can be formed on the surface of the diffusion barrier. In cases in which the conductive material to be subsequently and directly formed on the diffusion barrier, the optional plating seed layer is not needed. The optional plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. The thickness of the optional seed layer may vary depending on the material of the optional plating seed layer as well as the technique used in forming the same. Typically, the optional plating seed layer has a thickness from 2 to 80 nm. The optional plating seed layer can be formed by a conventional deposition process including, for example, CVD, PECVD, ALD, and PVD.

A conductive material (which after deposition and planarization forms conductive material 14 in FIG. 1) is formed atop the first dielectric material layer 12 and within the at least one opening. The conductive material may comprise polySi, SiGe, a conductive metal, an alloy comprising at least one conductive metal, a conductive metal silicide or combinations thereof. In one embodiment, the conductive material is a conductive metal such as Cu, W or Al. In another embodiment, the conductive material is Cu or a Cu alloy (such as AlCu). The conductive material may be formed by a deposition process including chemical vapor deposition (CVD), plasma enhanced chemical vapor deposition (PECVD), sputtering, chemical solution deposition or plating that fills the at least one opening from the bottom upwards. In one embodiment, a bottom-up plating process is employed in forming the conductive material.

Following the deposition of the conductive material, a planarization process such as, for example, chemical mechanical polishing (CMP) and/or grinding, can be used to remove all material that is present outside the at least one opening forming at least conductive material 14 embedded within the first dielectric material layer 12. The planarization stops on an upper surface of the first dielectric material layer 12 providing the coplanar structure illustrated in FIG. 1. If a diffusion barrier and an optional plating seed layer are present, the planarization process would provide a U-shaped diffusion barrier and a U-shaped plating seed layer within the at least one opening. The U-shaped diffusion barrier and the U-shaped plating seed layer would be interposed between the first dielectric material layer 12 and the conductive material 14 that is embedded therein. Also, the U-shaped diffusion barrier and the U-shaped plating seed layer would each have an upper surface that is co-planar with an upper surface of both the first dielectric material layer 12 and the conductive material 14.

Figure 2:
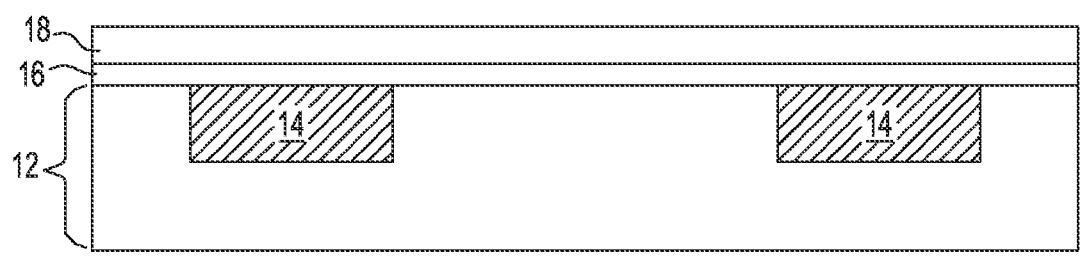
FIG. 2 is a pictorial representation (through a cross sectional view) illustrating the initial structure of FIG. 1 after forming a dielectric capping layer and a second dielectric material layer atop the initial structure.

Referring to FIG. 2, there is illustrated the initial structure 10 of FIG. 1 after forming a dielectric capping layer 16 and a second dielectric material layer 18 atop the initial structure 10, i.e., atop the exposed upper surfaces of the first dielectric material layer 12 and the at least one conductive material 14 that is embedded within the first dielectric material layer 12.

The dielectric capping layer 16 shown in FIG. 2 can include any suitable dielectric capping material such as, for example, SiC, $Si_4NH_3$, $SiO_2$, a carbon doped oxide, a nitrogen and hydrogen doped silicon carbide SiC(N,H) or multilayers thereof. The dielectric capping layer 16 can be formed utilizing a conventional deposition process such as, for example, chemical vapor deposition, plasma enhanced chemical vapor deposition, chemical solution deposition, evaporation, and atomic layer deposition. The thickness of the dielectric capping layer 16 may vary depending on the technique used to form the same as well as the material make-up of the layer. Typically, the dielectric capping layer 16 has a thickness from 15 to 100 nm, with a thickness from 25 to 45 nm being more typical.

The second dielectric material layer 18 shown in FIG. 2 may be comprised of one of the dielectric materials mentioned above for the first dielectric material layer 12. In one embodiment, the second dielectric material layer 18 is comprised of a same dielectric material as the first dielectric material layer 12. In another embodiment, the second dielectric material layer 18 is comprised of a different dielectric material as the first dielectric material layer 12. The second dielectric material layer 18 can be formed utilizing one of the deposition processes mentioned above for forming the first dielectric material layer 12, and the thickness of the second dielectric material layer 18 is within the range mentioned above for the first dielectric material layer 12.

Figure 3:
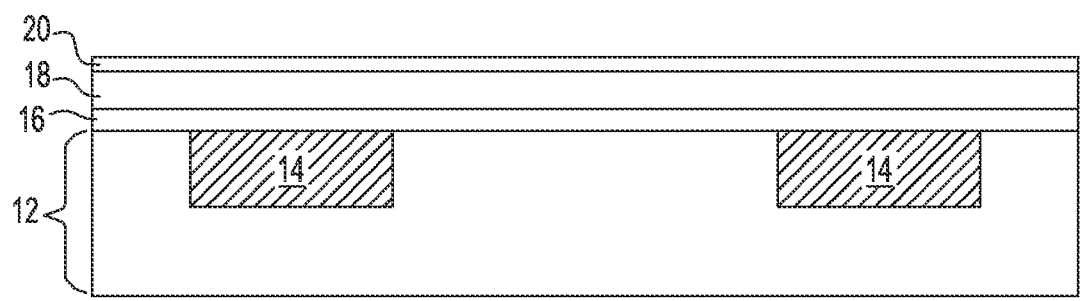
FIG. 3 is a pictorial representation (through a cross sectional view) illustrating the structure of FIG. 2 after performing a surface treatment process that forms a nitrogen enriched dielectric surface layer in an upper portion of the second dielectric material layer.

Referring to FIG. 3, there is illustrated the structure of FIG. 2 after performing a surface treatment, i.e., nitridation process, in which a nitrogen enriched dielectric surface layer 20 is formed within an exposed upper surface of the second dielectric material layer 18. By "nitrogen enriched dielectric surface layer" it is meant, that the exposed upper surface of the second dielectric material layer 18 has a higher nitrogen content therein after performing the nitridation process as compared to the originally deposited second dielectric material layer 18. The nitrogen enriched dielectric surface layer 20 may also be referred to as a nitrided surface.

As stated above, the nitrogen enriched dielectric surface layer 20 is formed by subjecting the structure shown in FIG. 2 to a nitridation process. In one embodiment, the nitridation process used in forming the nitrogen enriched dielectric surface layer 20 is a thermal nitridation process. When a thermal nitridation process is employed, no damage to the second dielectric material layer 18 is observed. The thermal nitridation process that is employed in the present disclosure does not include an electrical bias higher than 200 W. In some embodiments, no electrical bias is performed during the thermal nitridation process.

The thermal nitridation process employed in the present disclosure is performed in any nitrogen-containing ambient, which is not in the form of a plasma. The nitrogen-containing ambients that can be employed in the present disclosure include, but are not limited to, $N_2$, $NH_3$, $NH_4$, NO, and $NH_x$ wherein x is between 0 and 1. Mixtures of the aforementioned nitrogen-containing ambients can also be employed in the present disclosure. In some embodiments, the nitrogen-containing ambient is used neat, i.e., non-diluted. In other embodiments, the nitrogen-containing ambient can be diluted with an inert gas such as, for example, He, Ne, Ar and mixtures thereof. In some embodiments, $H_2$ can be used to dilute the nitrogen-containing ambient.

Notwithstanding whether the nitrogen-containing ambient is employed neat or diluted, the content of nitrogen within the nitrogen-containing ambient employed in the present disclosure is typically from 10% to 100%, with a nitrogen content within the nitrogen-containing ambient from 50% to 80% being more typical.

In one embodiment, the thermal nitridation process employed in the present disclosure is performed at a temperature from 50° C. to 450° C. In another embodiment, the thermal nitridation process employed in the present disclosure is performed at a temperature from 100° C. to 300° C.

In addition to a thermal nitridation process, the formation of the nitrogen enriched dielectric surface layer 20 can include a plasma nitridation process. When a plasma nitridation process is employed, an electrical bias of about 200 W or greater can be employed. The plasma nitridation process is performed by generating a plasma from one of the nitrogen-containing ambients that is mentioned above for the thermal nitridation process. In one embodiment, the plasma nitridation process employed in the present disclosure is performed at a temperature from 50° C. to 450° C. In another embodiment, the plasma nitridation process employed in the present disclosure is performed at a temperature from 100° C. to 300° C.

Notwithstanding the type of nitridation employed, the depth of the nitrogen enriched dielectric surface layer 20 may vary. Typically, the depth of the nitrogen enriched dielectric surface layer 20, as measured from the outer most exposed surface of the first dielectric material layer 18 inward, is from 0.5 nm to 20 nm, with a depth from 1 nm to 10 nm being more typical.

Figure 4:
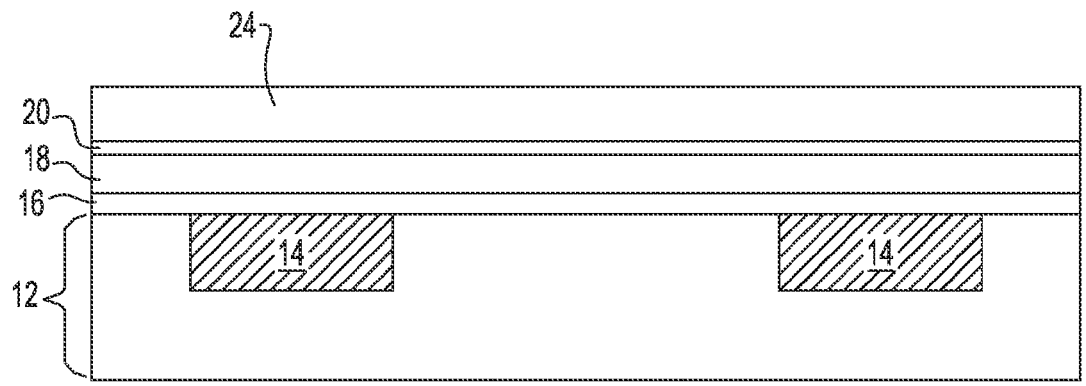
FIG. 4 is a pictorial representation (through a cross sectional view) illustrating the structure of FIG. 3 after forming a metal nitride layer on the nitrogen enriched dielectric surface layer.
Figure 5:
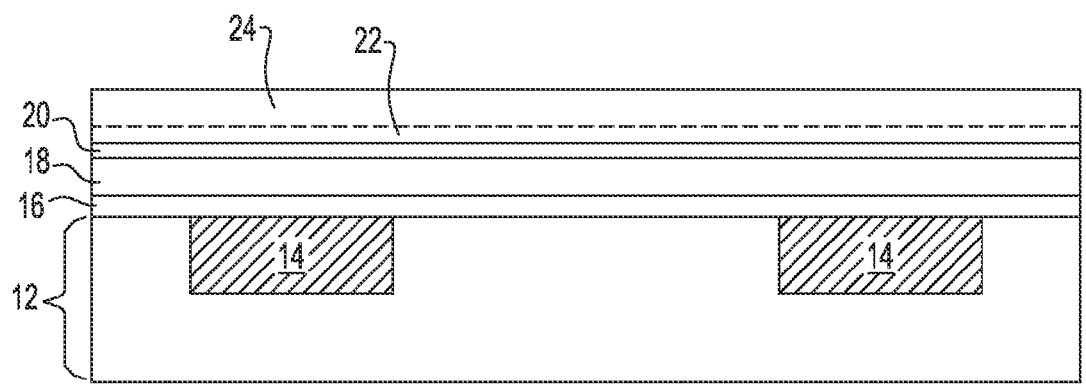
FIG. 5 is a pictorial representation (through a cross second view) illustrating the structure of FIG. 4 in which another metal nitride layer forms in-situ in a lower region of the metal nitride layer; the another metal nitride layer that forms in-situ boasts the overall nitrogen content of the deposited nitride layer to greater than 60 atomic % nitrogen.

Referring now to FIG. 4, there is illustrated the structure of FIG. 3 after forming a metal nitride layer 24 on the nitrogen enriched dielectric surface layer 20. FIG. 5 illustrates the structure of FIG. 4 after another metal nitride layer 22 forms in a lower region of the metal nitride layer 24 by the in-situ reaction of metal atoms from the metal nitride layer 24 with nitrogen atoms from the underlying nitrogen enriched dielectric surface layer 20. As shown, the another metal nitride layer 22 forms in a lower portion of the metal nitride layer 24 (represented by the dotted lines in the drawings). As such, the another metal nitride layer 22 is positioned between the nitrogen enriched dielectric surface layer 20 and the metal nitride layer 24. Since the another metal nitride layer 22 is formed in-situ, the another metal nitride layer 22 is composed of the same metal as that of metal nitride layer 24.

In one embodiment of the present disclosure, the in-situ formation of the another metal nitride layer 22 occurs during the formation of the metal nitride layer 24. In another embodiment, the in-situ formation of the another metal nitride layer 22 occurs after complete formation of the metal nitride layer 24. In yet another embodiment, in-situ formation of the another metal nitride layer 22 occurs both during and after forming the metal nitride layer 24. It is observed that the metal nitride layer 24 and the another metal nitride layer 22 that is formed in a lower region of the metal nitride layer 24 form the metal resistor of the present disclosure.

The metal nitride layer 24 that is formed in the present disclosure includes, but is not limited to, TaN, TiN, RuN, CoN, WN and TaRuN. In one embodiment, the metal nitride layer 24 is composed of TaN. The metal nitride layer 24 can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition and plating. Typically, the deposited metal nitride layer 24 that is formed has a nitrogen content that is less than 50 atomic % nitrogen. However, after the another metal nitride layer 22 forms in-situ, the combination of the metal nitride layer 24 and the another metal nitride layer 22 provides a metal resistor that has a nitrogen content that is greater than 60 atomic %. The metal nitride layer 24 that is formed typically has a thickness from 2 nm to 50 nm, with a thickness from 5 nm to 20 nm being more typical. The another metal nitride layer 22 that is formed in-situ typically has a thickness from 0.5 nm to 20 nm, with a thickness from 1 nm to 10 nm being more typical.

Figure 9A:
FIGS. 9A and 9B are pictorial representations (through cross sectional views) depicting various high-nitrogen content metal resistors that can be formed in the present disclosure. In each of the drawings, the high-nitrogen content metal resistor includes the metal nitride layer and the another metal nitride layer that forms in-situ in a lower region of the metal nitride layer.
Figure 9B:
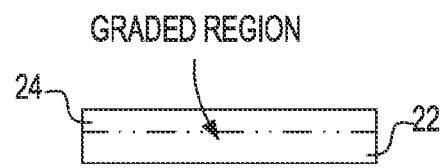

In some embodiments of the present disclosure, a bilayer resistor containing the another metal nitride layer 22 and the metal nitride layer 24 is formed. The bilayer resistor has a distinct interface between the another metal nitride layer 22 and the metal nitride layer 24. This is shown in FIG. 9A. In another embodiment, and as shown in FIG. 9B, a gradient resistor is formed in which the content of nitrogen within the structure decreases upward from the nitrogen enriched surface layer 20 of the second dielectric material layer 18.

It is noted that in the various embodiments of the present disclosure, the nitrogen content within the nitrogen enriched dielectric surface layer 18 typically decreases after forming the in-situ metal nitride layer 22 from its original value.

Figure 6:
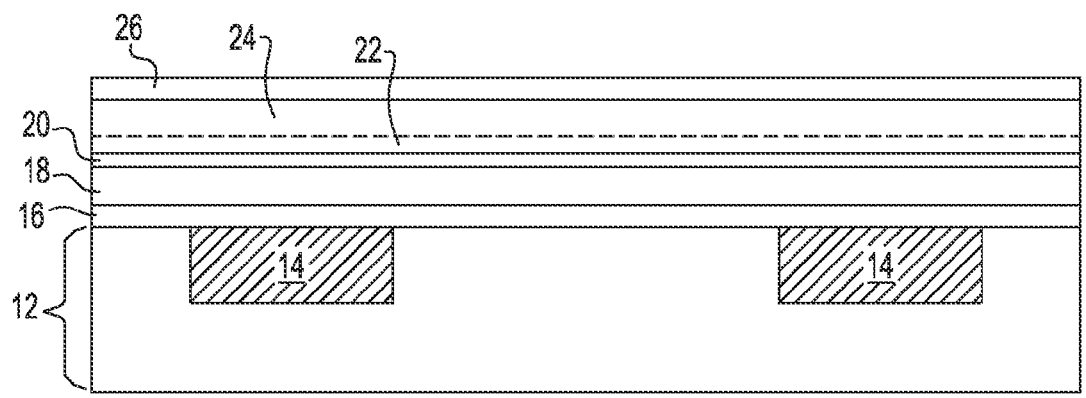
FIG. 6 is a pictorial representation (through a cross sectional view) illustrating the structure of FIG. 5 after forming another dielectric capping layer atop the metal nitride layer.

Referring now to FIG. 6, there is illustrated the structure of FIG. 5 after forming another dielectric capping layer 26 atop the metal nitride layer 24. The another dielectric capping layer 26 may include one of the materials mentioned above for dielectric capping layer 16. In one embodiment, the another dielectric capping layer 26 includes the same dielectric material as dielectric capping layer 16. In another embodiment, the another dielectric capping layer 26 includes a different dielectric material as dielectric capping layer 16. The another dielectric capping layer 26 can be formed utilizing one of the techniques mentioned above for forming dielectric capping layer 16. Also, the another dielectric capping layer 26 can have a thickness within the range mentioned above for dielectric capping layer 16.

Figure 7:
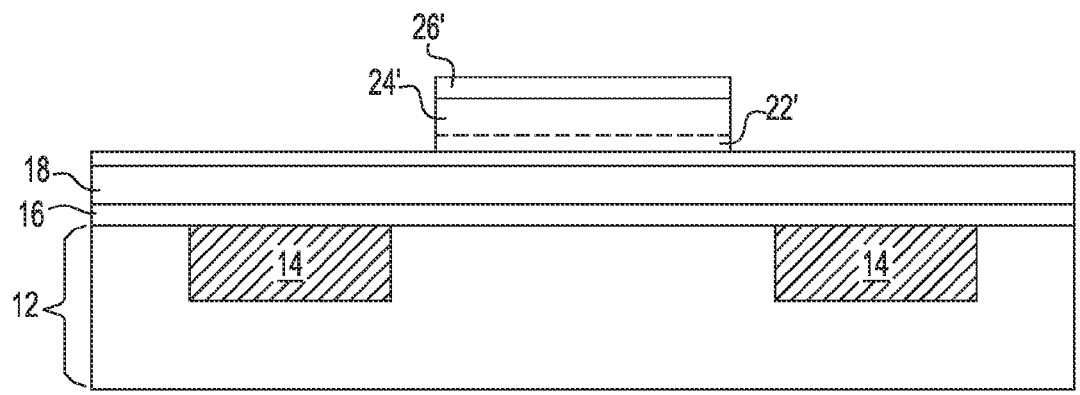
FIG. 7 is a pictorial representation (through a cross sectional view) illustrating the structure of FIG. 6 after patterning the another dielectric capping layer, the metal nitride layer and the another metal nitride layer.

Referring now to FIG. 7, there is illustrated the structure of FIG. 6 after patterning the another dielectric capping layer 26, the metal nitride layer 24 and the another metal nitride layer 22 into a patterned material stack. The patterned material stack includes the high-nitrogen content metal resistor of the present disclosure. The patterning of the another dielectric capping layer 26, the metal nitride layer 24 and the another metal nitride layer 22 can be achieved by lithography and etching. The etching step may include a single etch. Alternatively, multiple etching steps can be used in patterning the another dielectric capping layer 26, the metal nitride layer 24 and the another metal nitride layer 22. As shown in the drawings, the patterned another dielectric capping layer 26', the patterned metal nitride layer 24' and the patterned another metal nitride layer 22' have sidewalls that are vertical coincident to each other. The etching step can stop atop an upper surface of the nitrogen enriched dielectric surface layer 20, or it can stop on an upper surface of the second dielectric material layer 18. In the later embodiment, portions of the nitrogen enriched dielectric surface layer 20 that are not protected by the patterned material stack can be removed.

Figure 8:
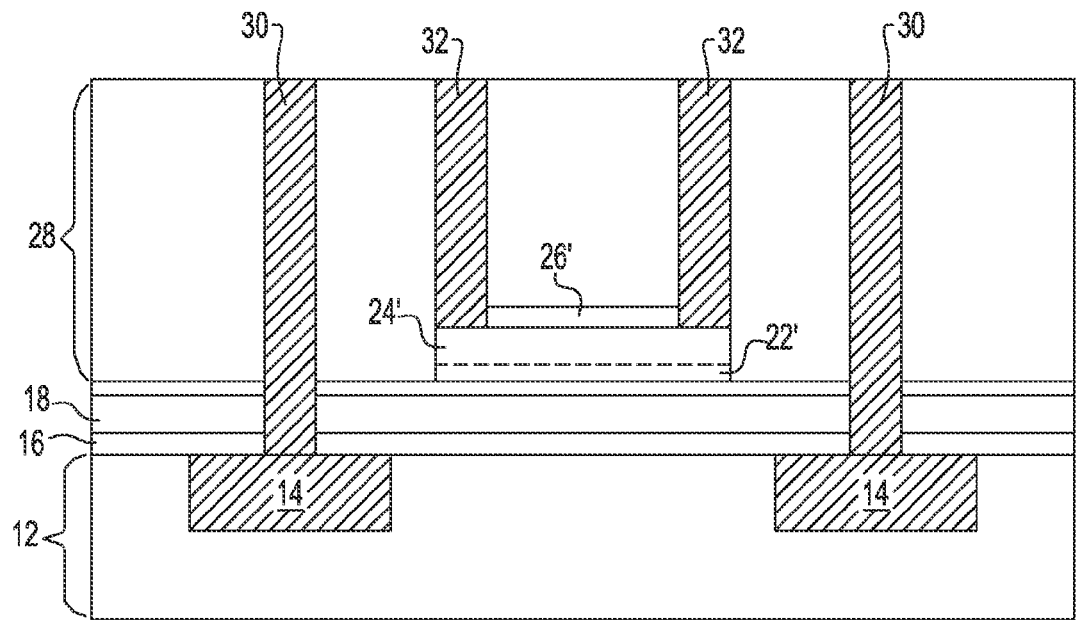
FIG. 8 is a pictorial representation (through a cross sectional view) illustrating the structure of FIG. 7 after further interconnect processing steps are performed.

Referring now to FIG. 8, there is illustrated the structure of FIG. 7 after further interconnect processing steps are performed. The further interconnect processing steps may include formation of a third dielectric material layer 28 and metal structures 30 and 32. As shown, metal structures 30 extend to, and are in direct contact with, an upper surface of the at least one conductive material 14 formed in the first dielectric material layer 12, while metal structures 32 extend to, and are in direct contact with, an upper surface of the patterned metal nitride layer 24'. In one embodiment, and as shown, the metal structures 32 are located an opposing ends of the patterned metal nitride layer 24'.

The third dielectric material layer 28 may comprise one of the dielectric materials mentioned above for the first dielectric material layer 12. In one embodiment, the third dielectric material layer 28 may comprise the same dielectric material as the first dielectric material layer 12. In another embodiment, the third dielectric material layer 28 may comprise a different dielectric material as the first dielectric material layer 12. The third dielectric material layer 28 can be formed utilizing one of the techniques mentioned above for the first dielectric material layer 12. The thickness of the third dielectric material layer 28 is also within the range mentioned above for the first dielectric material layer 12. Typically, the thickness of the third dielectric material layer 28 is greater than the thickness of the first dielectric material layer 12.

The metal structures 30 and 32 can include one of the conductive materials mentioned above for conductive material 14. In one embodiment, the metal structures 30 and 32 may comprise the same conductive material as conductive material 14. In another embodiment, the metal structures 30 and 32 may comprise a different conductive material as conductive material 14. The metal structures 30 and 32 can be formed utilizing the same technique as mentioned above for forming the conductive material 14 embedded in the first dielectric material 12. That is, lithography, etching and filling openings with a conductive material can be employed. In some embodiments, a diffusion barrier and a plating seed layer can be formed prior to filling the openings with the conductive material. Following the filling of the openings with at least the conductive material, a planarization process can be performed in order to form the structure illustrated in FIG. 8.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:
1. A method of forming a metal resistor comprising:
    forming a nitrogen enriched dielectric surface layer within an upper region of a dielectric material layer; and
    forming a metal nitride layer on an upper surface of the nitrogen enriched dielectric surface layer, wherein during and/or after said forming the metal nitride layer, another metal nitride layer forms in-situ in a lower region of the metal nitride layer.
2. The method of claim 1, wherein said forming the nitrogen enriched dielectric surface layer comprises performing a thermal nitridation process.
3. The method of claim 2, wherein said thermal nitridation process is performed at a temperature from 50° C. to 450° C.
4. The method of claim 2, wherein said thermal nitridation is performed in a nitrogen-containing ambient, said nitrogen-containing ambient is selected from the group consisting of $N_2$, $NH_3$, $NH_4$, NO, and $NH_x$ wherein x is between 0-1.
5. The method of claim 1, wherein said forming the nitrogen enriched dielectric surface layer comprises a plasma nitridation process.
6. The method of claim 5, wherein said plasma nitridation process is performed at a temperature from 50° C. to 450° C.
7. The method of claim 5, wherein said plasma nitridation process includes generating a plasma from a nitrogen-containing ambient, said nitrogen-containing ambient is selected from the group consisting of $N_2$, $NH_3$, $NH_4$, NO, and $NH_x$ wherein x is between 0-1.
8. The method of claim 1, wherein said metal nitride layer and said another metal nitride layer comprise a bilayer resistor with a distinct interface located therebetween.

9. The method of claim 1, wherein said metal nitride layer and said another metal nitride layer provide a resistor having a graded nitrogen content.

10. The method of claim 1, wherein said metal nitride layer and said another metal nitride layer provide a resistor having greater than 60 atomic % nitrogen located therein.

11. The method of claim 1, wherein said another metal nitride layer forms by reacting metal atoms from said metal nitride layer with nitrogen atoms from said nitrogen enriched dielectric surface layer.

12. The method of claim 1, further comprising forming a dielectric capping layer atop the metal nitride layer, and patterning the dielectric capping layer, the metal nitride layer and the another metal nitride layer.

13. A method of integrating a resistor within an interconnect structure comprising:

provided a first dielectric material layer having at least one conductive material embedded therein;

forming a dielectric capping layer atop the first dielectric material layer and atop the at least one conductive material;

forming a second dielectric material layer atop the dielectric capping layer;

forming a nitrogen enriched dielectric surface layer within an upper region of the second dielectric material layer;

forming a metal nitride layer atop the nitrogen enriched dielectric surface layer, wherein during and/or after the forming of the metal nitride layer, another metal nitride layer forms in-situ in a lower region of the metal nitride layer;

forming another dielectric capping layer atop the metal nitride layer;

patterning the another dielectric capping layer, the metal nitride layer and the another metal nitride layer to form a patterned material stack; and forming a third dielectric material layer having a plurality of conductive structures embedded therein atop the exposed nitrogen enriched dielectric surface layer and said patterned material stack.

14. The method of claim 13, wherein said forming the nitrogen enriched dielectric surface layer comprises performing a thermal nitridation process or performing a plasma nitridation process.

* * * * *